US005834951A

United States Patent [19]
Klein

[11] Patent Number: 5,834,951
[45] Date of Patent: Nov. 10, 1998

[54] CURRENT AMPLIFIER HAVING A FULLY DIFFERENTIAL OUTPUT WITHOUT A D. C. BIAS AND APPLICATIONS THEREOF

[75] Inventor: Hans W. Klein, Danville, Calif.

[73] Assignee: IMP, Inc., San Jose, Calif.

[21] Appl. No.: 487,864

[22] Filed: Jun. 7, 1995

Related U.S. Application Data

[62] Division of Ser. No. 355,082, Dec. 13, 1994, abandoned, which is a division of Ser. No. 248,383, May 24, 1994, Pat. No. 5,565,815, which is a continuation-in-part of Ser. No. 198,135, Feb. 16, 1994, abandoned, which is a continuation-in-part of Ser. No. 168,435, Dec. 17, 1993, Pat. No. 5,444,579.

[51] Int. Cl.[6] ........................................................ H03F 3/45
[52] U.S. Cl. .................................... 327/53; 327/205
[58] Field of Search .................................. 327/65, 66, 67, 327/89, 52, 53, 54, 205, 206; 330/252, 253, 257, 277, 288

[56] References Cited

U.S. PATENT DOCUMENTS

| | | | |
|---|---|---|---|
| 3,452,289 | 6/1969 | Ryan | 330/254 |
| 3,988,595 | 10/1976 | Eatock | 327/67 |
| 4,223,275 | 9/1980 | Den Brinker | 330/257 |
| 4,404,529 | 9/1983 | Rossum et al. | 330/803 |
| 4,575,643 | 3/1986 | Sakai | 363/127 |
| 4,717,838 | 1/1988 | Brehmer et al. | 327/66 |
| 4,829,266 | 5/1989 | Pernici et al. | 330/253 |
| 4,887,047 | 12/1989 | Somerville | 330/257 |
| 4,912,393 | 3/1990 | Anderson et al. | 323/316 |
| 4,929,910 | 5/1990 | Pace et al. | 330/257 |
| 4,994,774 | 2/1991 | Joosse | 333/172 |
| 5,043,674 | 8/1991 | Bonaccio et al. | 330/257 |
| 5,063,356 | 11/1991 | Voorman | 330/306 |
| 5,122,680 | 6/1992 | Stakely et al. | 327/206 |
| 5,146,179 | 9/1992 | Carley et al. | 330/253 |
| 5,200,751 | 4/1993 | Smith | 341/147 |
| 5,258,760 | 11/1993 | Moody et al. | 341/166 |
| 5,278,478 | 1/1994 | Moody et al. | 218/560 |
| 5,325,317 | 6/1994 | Petersen et al. | 364/724.01 |
| 5,334,883 | 8/1994 | Rosenthal | 327/206 |
| 5,362,994 | 11/1994 | Lin | 327/206 |
| 5,369,319 | 11/1994 | Good et al. | 327/206 |
| 5,404,054 | 4/1995 | Kotowski | 327/205 |
| 5,424,675 | 6/1995 | Matsushita | 327/558 |
| 5,446,409 | 8/1995 | Katakura | 327/538 |

OTHER PUBLICATIONS

Pierzchala et al., "High Speed Field Programmable Analog Array Architecture Design," *FPGA '94,* Berkeley, California, Feb. 1994, pp. 1–10.

*Primary Examiner*—Timothy P. Callahan
*Assistant Examiner*—My Trang Nu Ton
*Attorney, Agent, or Firm*—Majestic, Parsons, Siebert & Hsue

[57] ABSTRACT

A balanced current amplifier mirrors either a fully differential or single ended input signal into common output circuits in a manner to generate a fully differential output signal without any d.c. bias. Input signal nodes are maintained at a desired voltage by circuit elements other than those of the current mirror circuits, thus freeing the current mirroring elements from having to be sized for this purpose. The sizes of the output transistors are adjustable in order to set the gain of the circuit. In addition to amplifier circuits, a full-wave rectifier, a comparator, and a filter, all operating with current signals, are described. A single circuit module may include all of these circuits with a user provided the capability to program the module to perform any one or more of these functions.

3 Claims, 5 Drawing Sheets

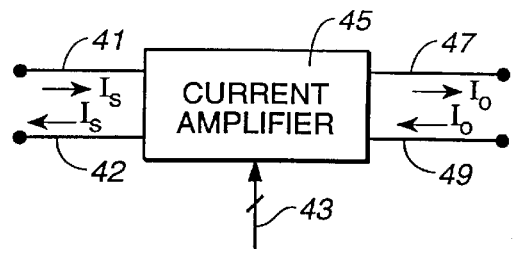
FIG._1
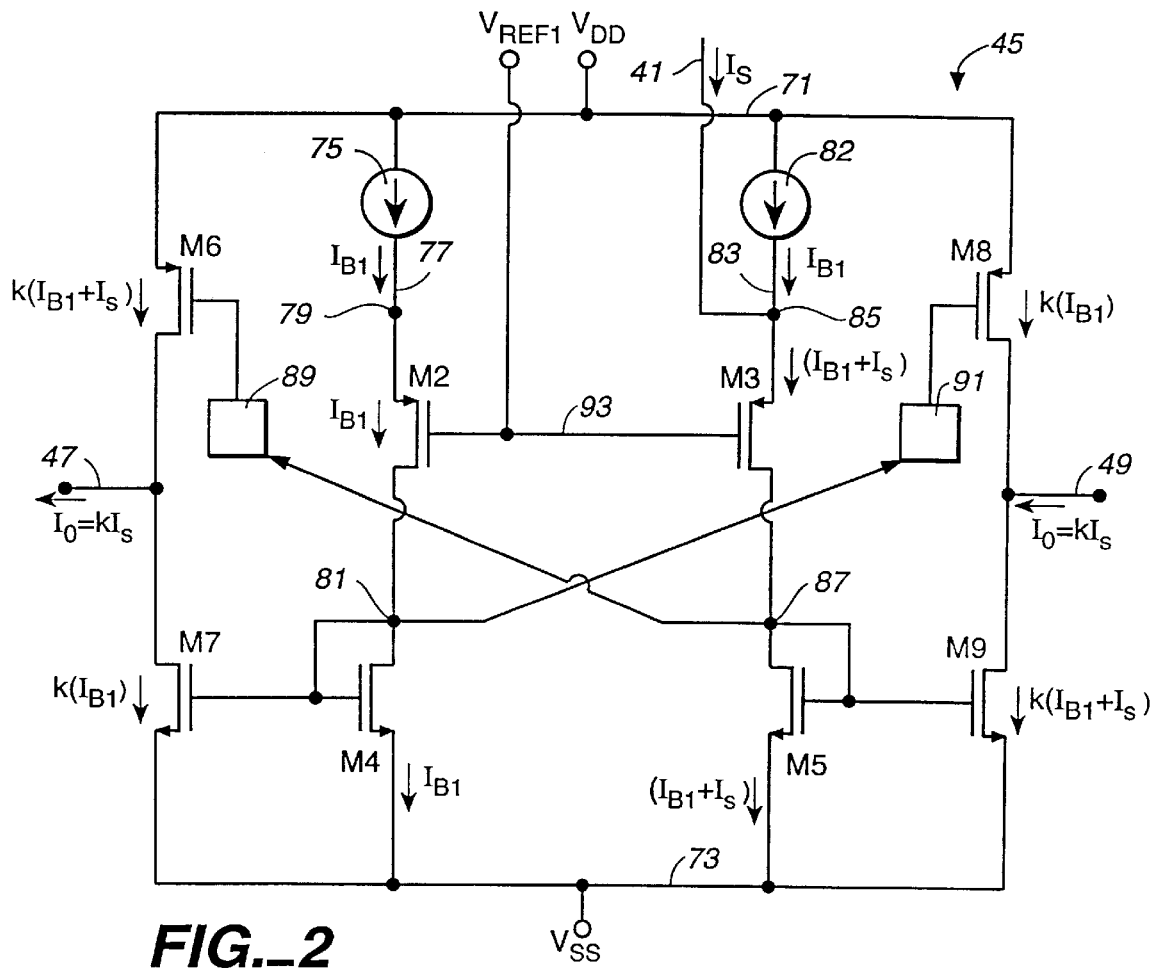
FIG._2
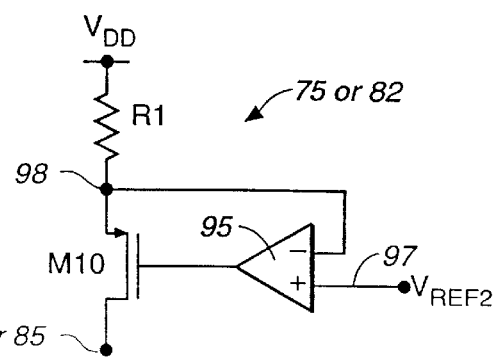
FIG._3

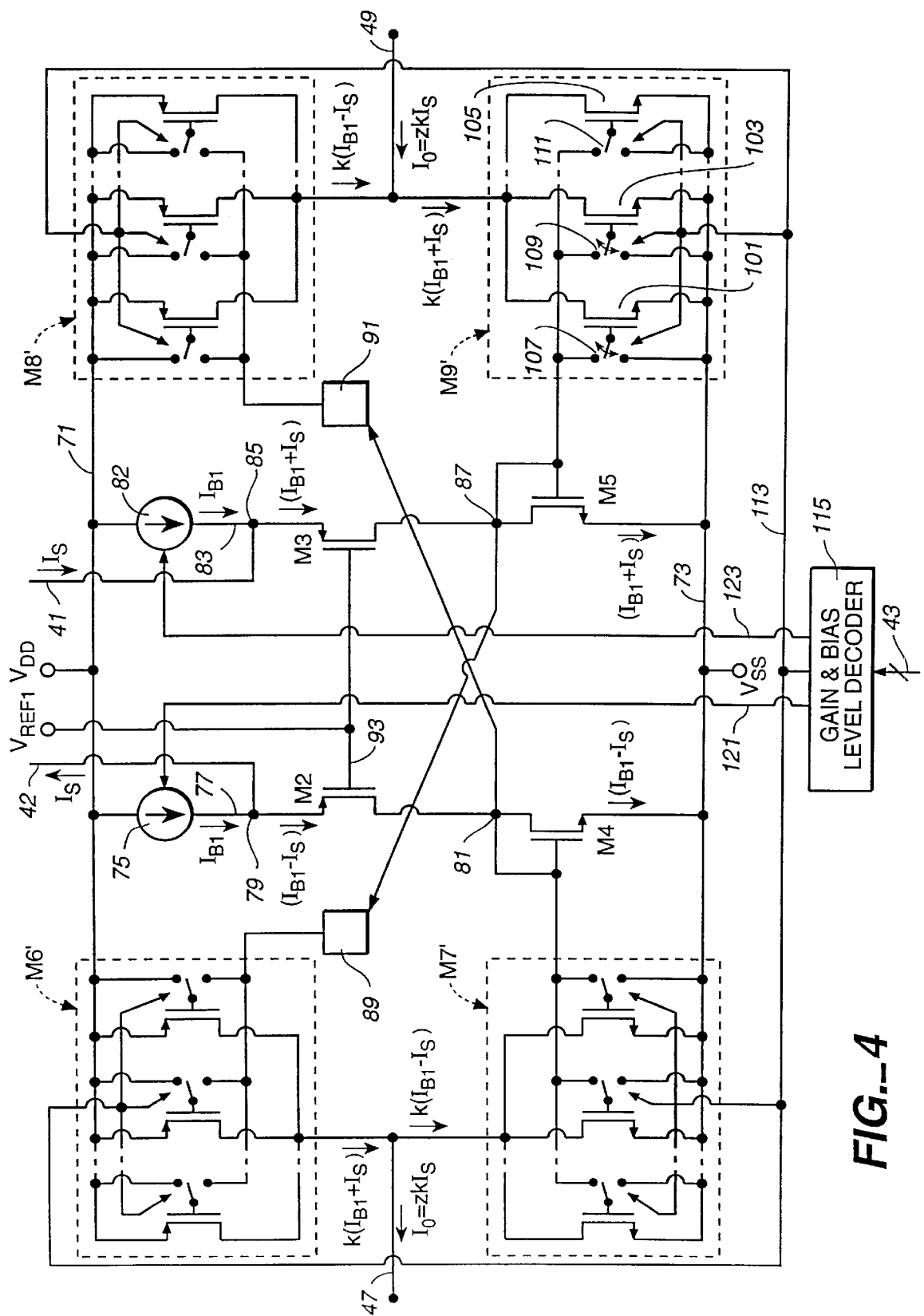
FIG._4

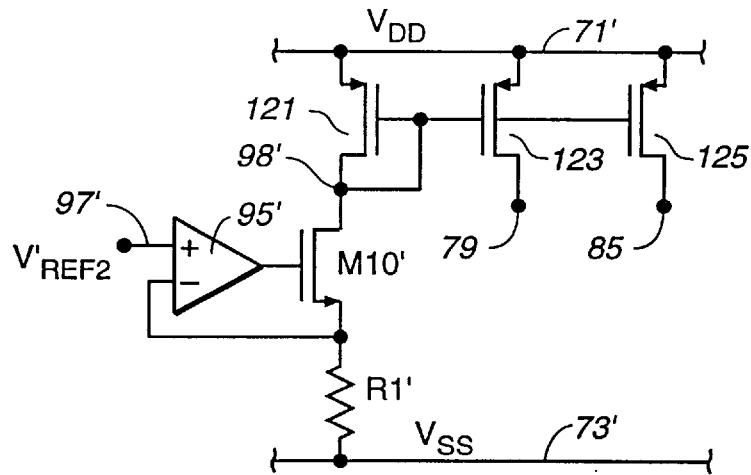
FIG._5
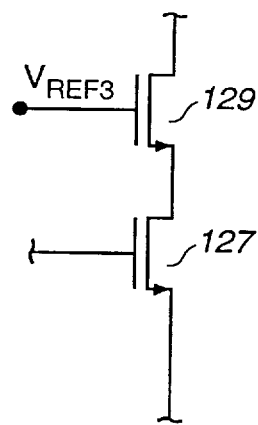
FIG._6
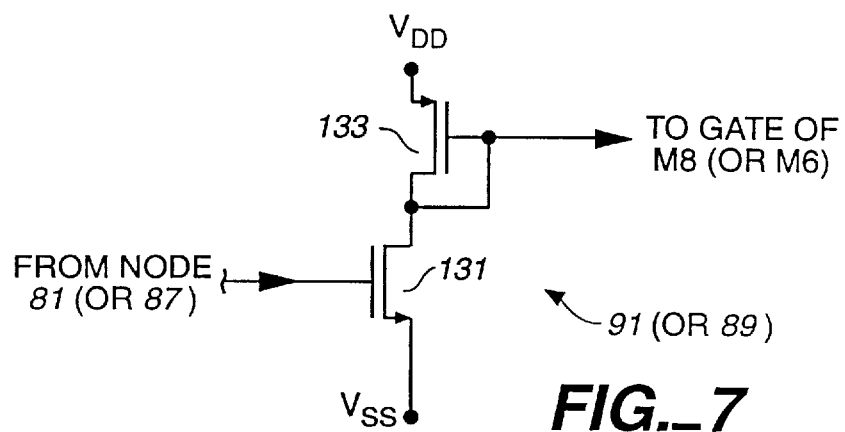
FIG._7
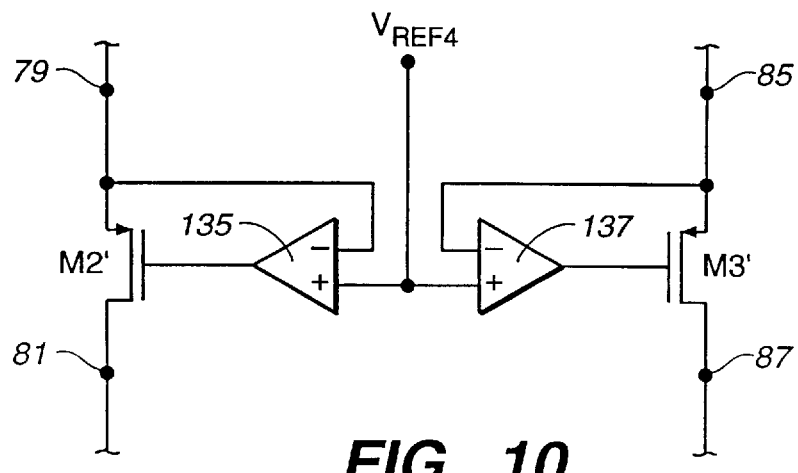
FIG._10

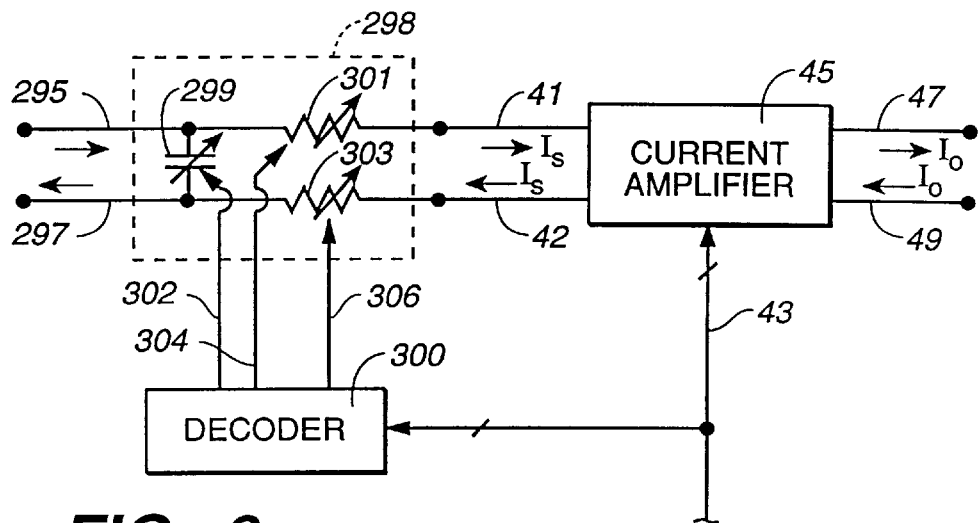
FIG._8
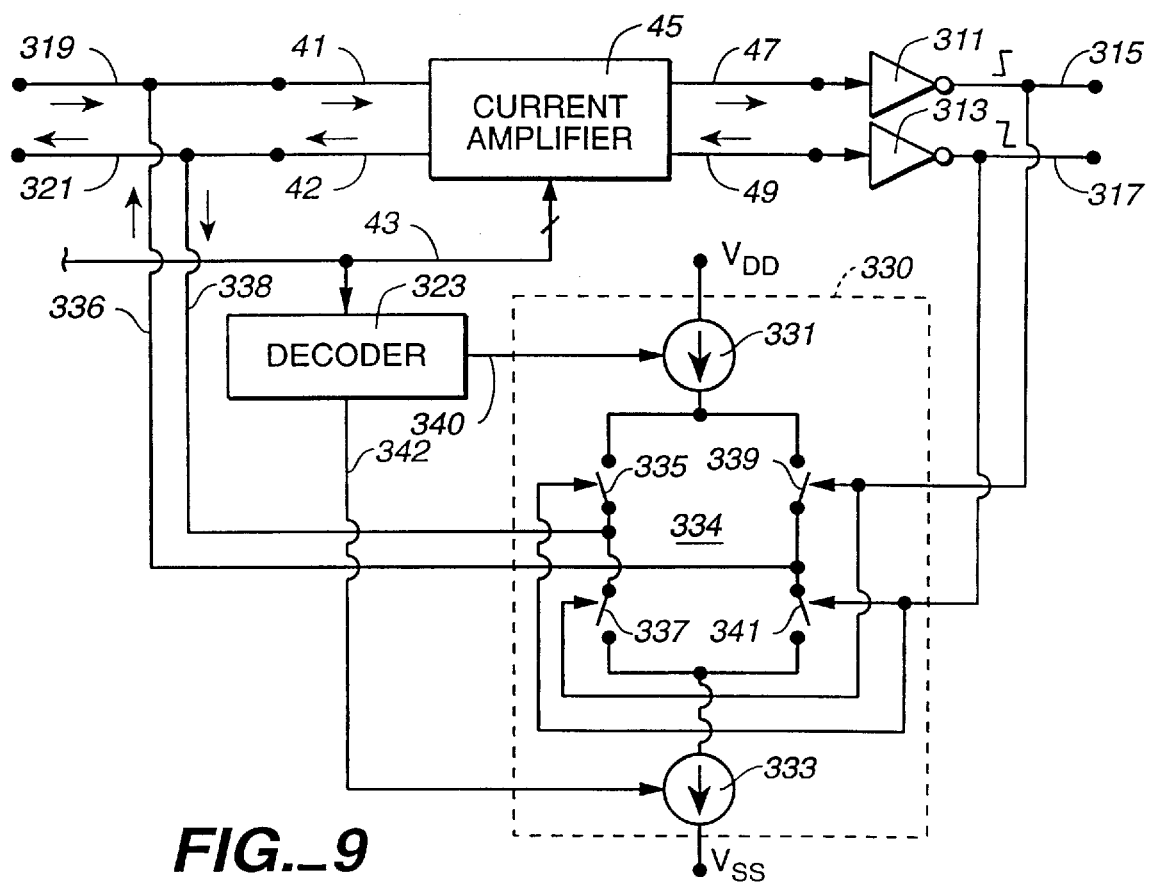
FIG._9

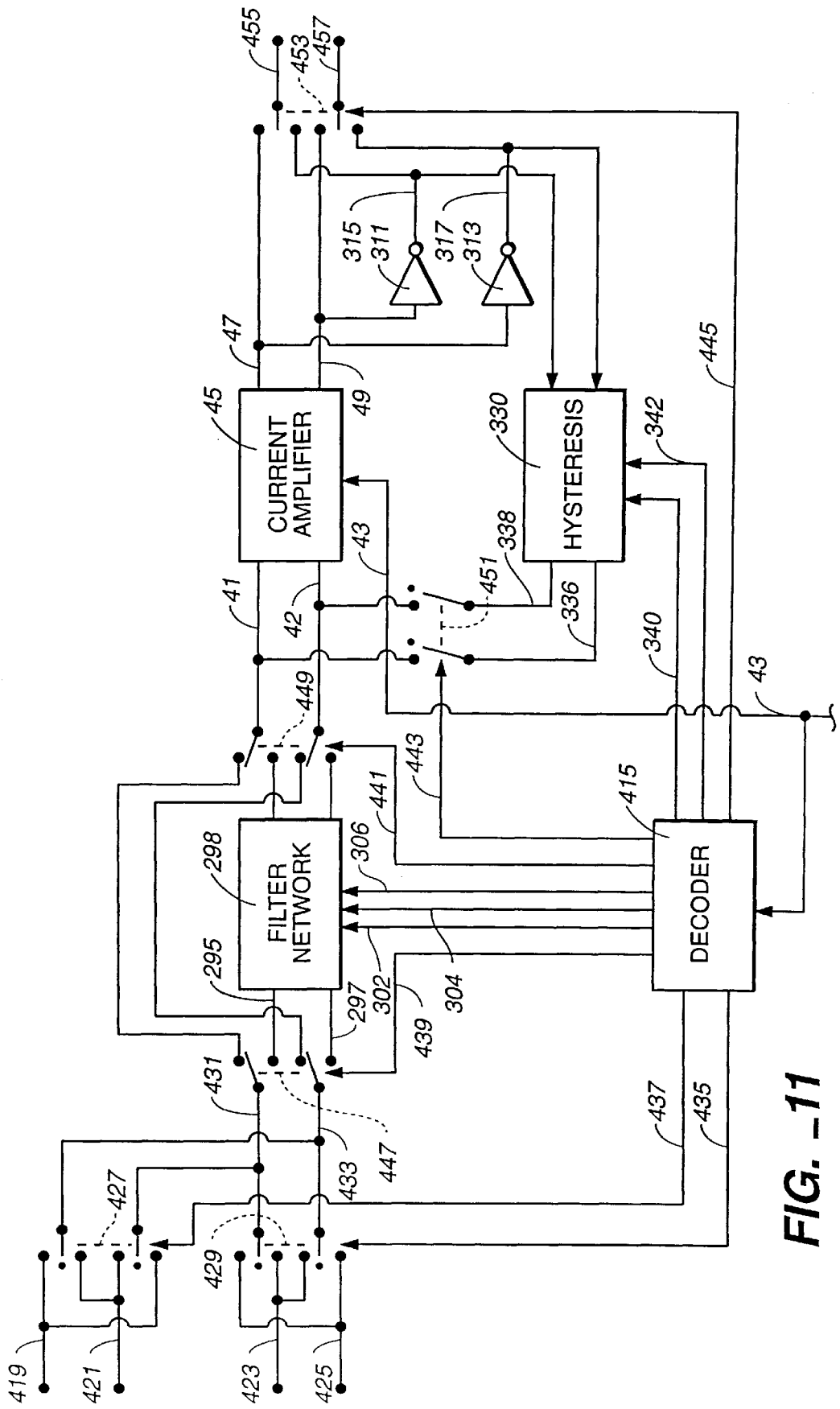
FIG. _11

CURRENT AMPLIFIER HAVING A FULLY DIFFERENTIAL OUTPUT WITHOUT A D. C. BIAS AND APPLICATIONS THEREOF

CROSS-REFERENCE TO A RELATED APPLICATION

This is a division of application Ser. No. 08/355,082, filed Dec. 13, 1994, now abandoned, which in turn is a division of Ser. No. 08/248,383, filed May 24, 1994, now U.S. Pat. No. 5,565,815, which is a continuation-in-part of application Ser. No. 08/198,135 filed Feb. 16, 1994, now abandoned, which in turn is a continuation-in-part of application Ser. No. 08/168,435, filed Dec. 17, 1993, now U.S. Pat. No. 5,444,579.

BACKGROUND OF THE INVENTION

This invention relates to current mode signal amplifiers and other current signal circuits which utilize a current amplifier.

It is a principal object of this invention to provide a current amplifier of a type using current mirror circuits that gives a fully differential current signal output without any d.c. bias component, at least whenever the signal input is fully differential or single ended.

It is another object of the present invention to provide a current amplifier whose gain can be easily set.

It is a further object of the present invention to optimize the input characteristics of a current amplifier circuit.

It is also an object of the present invention to provide other improved current signal circuits, including a rectifier, a filter and a comparator.

It is yet another object of the present invention to provide a module which may be configured into any one of a plurality of current signal circuits.

SUMMARY OF THE INVENTION

These and additional objects are realized from the present invention which, briefly and generally, according to a first aspect, forms a current amplifier by mirroring each signal of a two terminal d.c. biased current input into both of two separate output circuits, one for each of two output terminals, in a manner to provide a fully differential output with the d.c. bias cancelled from it. In a specific form of a current amplifier circuit, such an output results from either a fully differential current input signal or a single ended (only one input terminal carrying a signal) one.

According to another aspect of the present invention, the voltages at the two input signal nodes of the current amplifier are controlled by transistor elements separate from the signal mirroring transistors, thereby to control the amplifier input impedance independently of the current mirror circuits. This avoids having to make the signal mirroring transistors, and necessarily also their output transistors, larger than otherwise necessary, thus reducing the size required to implement the current amplifier on an integrated circuit chip.

According to a further aspect of the present invention, the amplifier input current bias sources can be made to be adjustable in order to allow the amplifier to perform other functions. One such function is a full wave rectifier, which is brought about by reducing the input current bias to zero.

According to yet another aspect of the present invention, a current amplifier having an extremely low input impedance works with a resistor-capacitor circuit connected to its input to form a current signal filter.

According to still another aspect of the present invention, a current amplifier is utilized as a comparator. The comparator is optionally provided with hysteresis by adding a fixed increment of current to the amplifier input signal.

According to another aspect of the present invention, a single circuit module is programmable into any one of a plurality of different functional current signal circuits, such as any of an amplifier, a rectifier, a filter or a comparator.

Additional objects, features and advantages of the various aspects of the present invention will become apparent from the following description of its preferred embodiments, which description should be taken in conjunction with the accompanying drawings.

BRIEF DESCRIPTION OF THE DRAWINGS

FIG. 1 illustrates the inputs and outputs of a current amplifier which embodies the various aspects of the present invention;

FIG. 2 is a schematic diagram of a first embodiment of the current amplifier of FIG. 1;

FIG. 3 is a circuit diagram of the current sources used in the current amplifier of FIG. 2;

FIG. 4 is a schematic diagram of a second embodiment of the current amplifier of FIG. 1;

FIG. 5 shows an alternate implementation of one portion of the embodiments of FIGS. 2 and 4;

FIG. 6 shows an alternate implementation of another portion of the embodiments of FIGS. 2 and 4;

FIG. 7 is a circuit diagram of two circuit portions used in each of the current amplifier embodiments of FIGS. 2 and 4;

FIG. 8 shows use of the current amplifier of the present invention to form a low pass filter for current signals;

FIG. 9 shows use of the current amplifier of FIG. 4 to form a fully differential signal comparator with adjustable hysteresis;

FIG. 10 shows a modification of the amplifier circuits of either FIGS. 2 or 4; and FIG. 11 is a block diagram of a single circuit module that can be configured into any one of the circuits of FIGS. 4, 8 or 9.

DESCRIPTION OF THE PREFERRED EMBODIMENTS

Referring initially to FIG. 1, a current amplifier 45 has current signal inputs in conductors 41 and 42, and current signal outputs in conductors 47 and 49. The specific embodiments of the current amplifier 45 described below each provide a fully differential current output in lines 47 and 49. That is, the output line 47 carries a positive going signal that is matched by a negative going signal in the line 49, or the other way around, depending upon the polarity of the signal. The current signals in the lines 47 and 49 have equal magnitude functions but are of opposite sign. For example, when the signal in the line 47 is increasing in magnitude, in the case of a fully differential output, the signal in the line 49 is decreasing in magnitude by the same amount. This fully differential output results, in the embodiments herein, when the input is either also fully differential (FIG. 4) or is single ended (FIG. 2).

The embodiment described below with respect to FIG. 4 accepts a fully differential input signal and, as a result, provides a fully differential output signal. The embodiment described below with respect to FIG. 2, however, accepts a signal in only the input line 41, the input line 42 (FIGS. 1 and 4) not being used. A fully differential output signal also results from the circuit embodiment of FIG. 2. Either embodiment can be provided with means to vary the amplification factor and/or other operating parameters, in response to a control signal in lines 43.

The first current amplifier embodiment, shown in FIG. 2, will now be described. This circuit is connected at a line 71 to one power supply terminal $V_{DD}$, which is usually a positive voltage, and at a line 73 to another power terminal $V_{SS}$, which is preferably a negative voltage with an absolute magnitude equal to $V_{DD}$. Alternatively, in other specific circuits, $V_{SS}$ is held at ground potential.

Two sources 75 and 82 of bias current $I_{B1}$ in respective lines 77 and 83 can be of any standard design, such as that conceptually illustrated in FIG. 3. Current is maintained constant through a resistance R1 by the voltage at a node 98 being compared by a differential amplifier 95 with a reference voltage $R_{REF2}$ applied to a line 97. More details of a circuit for generating the bias currents is given in FIG. 5, where elements functioning the same are identified by the same reference number but with a prime (') added. Rather than using a separate constant current source of the type of FIG. 3 everywhere required in the current mode circuit, a single such circuit is connected to drive a mirroring transistor 121. The current through that transistor is mirrored through transistors 123 and 125, which are connected, respectively, to nodes 79 and 85 of the FIG. 2 amplifier.

The current sources 75 and 82 drive current through respective series connected transistors M4 and M5. The current through the transistor M4 is the bias current $I_{B1}$, while the current through the transistor M5 is a sum of that bias current plus the input current $I_S$ that is inserted through line 41 into node 85. The input current $I_S$ will generally include both positive (flowing in the direction shown) and negative (flowing in an opposite direction) components.

Each of the transistors M4 and M5 of FIG. 2 is a mirroring transistor. The current through the transistor M4 is mirrored to output transistors M7 and M8. Similarly, the current through the transistor M5 is mirrored to output transistors M6 and M9. The output transistors M6 and M7 are connected in series across the voltage supply lines 71 and 73, with the output line 47 connected between them. Similarly, the output transistors M8 and M9 are connected across the voltage supply lines 71 and 73 with the output signal line 49 connected between them. Because the output transistor M6 is necessarily of a different type (p- or n-type) than its mirroring transistor M5, an appropriate conversion is made by a circuit indicated as 89 which can include yet another multi-transistor current mirror circuit. A similar conversion is made at 91 for the output transistor M8.

The circuit diagram of FIG. 7 is an example implementation of the blocks 89 and 91. This circuit acts as a current mirror which also inverts the polarity of the current. For example, a current through the transistor M4 (FIG. 2) toward $V_{SS}$ is mirrored through the circuit 91 into a current through the transistor M8 which flows from $V_{DD}$. Thus, a current through an n-channel device (transistor M4) is mirrored into a current through a p-channel device (transistor M8). The circuit 89 is the same, operating between transistors M5 and M6. No such conversion is required between the transistors M4 and M7, or between the transistors M5 and M9, because the transistors in each pair are of the same type.

The current amplifier of FIG. 2 combines two basic current mirror circuits (a first formed of transistors M4, M7 and current source 75, and a second formed of transistors M5, M9 and current source 82) in a unique way to provide a fully differential current output in lines 47 and 49 that contains no d.c. component. That is, as indicated by the current notations of FIG. 2 itself, there is no output current $I_0$ in either of the lines 47 or 49 unless there is some signal input $I_S$. This is brought about by mirroring current from each of the first and second basic current mirror circuits into the other. The current from transistor M4 of the first basic current mirror circuit is mirrored into the second by connection to another output transistor M8 of the second that is connected in series with its own output transistor M9. Similarly, the current from transistor M5 of the second basic mirror circuit is mirrored into the first by connection to the output transistor M6 that is added to the first basic mirror circuit for this purpose. Thus, bias current from the sources 75 and 82 is removed from the signal in each of the output lines 47 and 49 by this "cross-mirroring".

The lack of a d.c. bias in the signal output of a current amplifier is generally desired. One particular application provides a resistance connected across the lines 47 and 49 in order to convert the current output signal into a voltage signal. The circuit of FIG. 2 prevents a d.c. bias from constantly flowing through such an output resistor, thus eliminating a significant d.c. voltage.

The current amplifier of FIG. 2 provides an output current $I_0$ that is equal to the input current $I_S$ multiplied by a gain factor k. If all of the current mirror ratios are equal to one, then the overall amplification factor k is equal to one. In order to achieve a current mirror ratio of one, the transistors of the individual current mirrors are selected to be the same size. Looking at the current mirror of transistors M5 and M9, for example, it will be seen that the current through the transistor M5 is mirrored into the output transistor M9. Those currents will be the same if the transistors M5 and M9 have the same size. However, if transistor M9 is made to have a channel twice as wide as that of transistor M5 (that is, to have one half of the impedance between its source and drain), then the amplification factor k is equal to 2. In the circuit of FIG. 2, each of the output transistors M6–M9 needs to be of the same size as the other, relative to that of the transistors M4 and M5. The transistors M4 and M5 are made to have the same size. This relative size of the current mirror output transistors can be made programmable by including several transistors selectably connectable in parallel. For example, the output transistor M9 can be replaced by two or more transistors with their sources and drains connected in parallel, each of the individual transistors being of the same size as the mirroring transistor M5. The gates of these several output transistors making up the transistor M9 are then connected to a switch so one, two, three, or however many individual transistors make up the output transistor M9 may be connected together to the gate of the mirroring transistor M5. Such programmability, if provided in a modified version of the circuit of FIG. 2, is controlled by signals in the lines 43 of FIG. 1.

The use of transistors M2 and M3, provided respectively in the current paths of sources 75 and 82, is optional. When used, these transistors control the impedance of the input nodes 79 and 85 rather than the transistors M4 and M5. Since a very low input impedance is generally desired, the input transistors need to have a very low impedance. This is accomplished by making these input transistors very large, having wide channel widths, and/or by increasing the current bias level through these devices. If M4 and M5 are the input transistors, not only must their size be made large but the associated output transistors must be made correspondingly large in order to give the desired amplification factor. This consumes a great deal of space and/or increases the quiescent power consumption of the circuit. But when the transistors M2 and M3 are used, their large size does not compel making any other transistors larger than otherwise is required. Thus, the size of the mirroring transistors M4 and M5 and their several output transistors (M7, M9, etc.) can be significantly reduced when separate input transistors M2 and M3 are used. The amount of space required on a silicon chip to implement the amplifier is thus reduced.

The transistors M2 and M3 operate by setting a voltage at their respective nodes 79 and 85 to be that of the reference voltage $V_{REF1}$ applied in the line 93, plus a voltage drop across the gate and source of the devices M2 and M3. The voltage reference applied to the line 93 is chosen to be consistent with operating requirements of input circuits connected to the input nodes 79 and 85.

An alternative way of controlling these added two transistors is, as shown in FIG. 10, to drive their gates from the outputs of booster amplifiers. Outputs of differential amplifiers 135 and 137 drive the gates of the transistors M2' and M3', respectively. The inputs of these amplifiers are connected with the drains of the corresponding transistors, and their non-inverting inputs are commonly connected with a reference voltage $V_{REF4}$. This maintains the nodes 79 and 85 at a constant voltage even while the magnitude of the current input signal is changing. The result is to further reduce the amplifier input impedance, or to obtain the same input impedance with smaller transistors M2' and M3'. Transistors M2' and M3' correspond, respectively, to transistors M2 and M3 of FIG. 2, but are so noted because they may be smaller in size. This reduced size thus further reduces the area of an integrated circuit chip that is required to implement the amplifier of FIG. 2.

Each of the transistors in the amplifier shown in FIG. 2, except for transistors M2 and M3, may be cascoded for a higher gain accuracy and an increased output impedance. An example of a cascoded transistor is given in FIG. 6, wherein transistor 127 corresponds to one of the transistors M7 or M9 of FIG. 2. A cascading transistor 129 is connected in series with each such transistor, having its gate connected to a reference voltage source $V_{REF3}$.

Referring to FIG. 4, a second current mode amplifier circuit is shown. This embodiment is quite similar to that of FIG. 2 and retains the advantages of its outputs carrying no d.c. bias current and the use of input transistors M2 and M3. Indeed, a majority of the circuit is the same and thus identified by the same reference characters. When an element of the FIG. 4 embodiment is different but corresponds to an element of the FIG. 2 embodiment, the same reference character is used but with a prime (') added. A primary difference between the two embodiments is that the input node 79 of FIG. 4 receives a signal from the line 42. The circuit is adapted to operate with a fully differential current input signal in lines 41 and 42. Another difference between the two embodiments is that the circuit of FIG. 4 shows a detailed implementation of its adjustable impedance output transistors. The gain k of the amplifier is selected by applying an appropriate control signal in lines 43.

The effective width (size) of each of the output transistors M6'–M9' is made to be adjustable by use of the same circuit for each, so only the M9' circuit will be described in detail. That circuit includes two or more individual transistors (three transistors 101, 103, and 105 being shown) connected in parallel through their sources and drains, between the $V_{SS}$ voltage reference line 73 and the signal output line 49. The gates of each of these transistors are connected through respective switches 107, 109 and 111 to either the gate of the mirroring transistor M5 or the $V_{SS}$ line 73, depending upon the state of their respective control signals in control lines 113. The number of the individual transistors 101, 103, 105, . . . which have their gates connected to the gate of the transistor M5 controls the impedance of the output transistor M9'. The size of each of the transistors 101, 103, 105, . . . , in one example, is made to be the same as the transistor M5, although they do not need to all be the same size. The switching signals in the lines 113 are decoded from the control signal 43 by a decoding circuit 115. The control signal 43 is also shown in FIG. 4 to contain data to control the current levels of the bias sources 75 and 82. The decoding circuits 115 convert that data into individual control signals in circuits 121 and 123 to set the bias current level $I_{B1}$ of the sources 75 and 82, respectively.

The level of the bias current $I_{B1}$ of the current amplifier 45 is usually made to be greater than the expected peak input signal level in order to avoid clipping. If the peak signal levels are known to remain constant, the bias current can remain fixed and the ability to control it is unnecessary. However, if the bias level control shown in the circuit of FIG. 4 is utilized, the amplifier can then be used to perform other functions. For example, if the bias current sources 75 and 82 are set with $I_{B1}=0$, the circuit of FIG. 4 becomes a full wave rectifier.

Referring to FIG. 8, a low pass filter is shown which is implemented entirely in the current mode. It is unnecessary to convert from a current signal to a voltage signal, pass the voltage signal through a filter with a traditional architecture, and then convert the filtered voltage signal back into a current signal, as is most commonly done. The current amplifier 45 is preferably implemented by either of the FIG. 2 or FIG. 4 circuits. Since the filter of FIG. 8 is illustrated to receive a fully differential input signal, the current amplifier of FIG. 4 is used. If the input signal is single ended (namely, one of the lines held at ground or some other reference potential), either of the current amplifiers of FIGS. 2 or 4 can be employed. Also, other current amplifier circuits will also operate satisfactorily so long as they have similar input characteristics.

An input current signal in lines 295 and 297 will often be obtained from a high output impedance circuit, such as a current amplifier output. A passive filter network 298 includes a capacitor 299 connected across the lines 295 and 297, thereby to result in a voltage signal being generated across it. That voltage signal is applied to one terminal of each of series resistances 301 and 303 which have their other terminals connected to the respective inputs 41 and 42 of the current amplifier 45. Since the input impedance of the current amplifier is extremely low relative to the output impedance of a circuit driving these inputs, these resistors are virtually connected to a reference voltage and thus convert the voltage across the capacitor 299 into current inputs to the amplifier 45.

It can be seen that the voltage across the capacitor 299 decreases as the frequency of the signal applied to lines 295 and 297 increases. This provides a low pass filter. That is, low frequencies of the input signal are attenuated less by the filter network 298 than are its higher frequencies. The reverse may be obtained, to provide a high pass filter, when the capacitor 299 is replaced by a resistor and the resistors 301 and 303 are replaced by capacitors.

If it is desired to be able to configure the response of the filter, the capacitor 299 and resistors 301 and 303 are made to be individually adjustable in response to control signals in respective lines 302, 304, 306. These control signals are preferably obtained from a signal in the control lines 43 by a decoding circuit 300. In practice, the decoder 300 and the decoder 115 (FIG. 4) are combined in a single circuit, if both are utilized.

FIG. 9 shows a signal comparator that may be configured to operate with a controlled level of hysteresis. The core of this circuit is also the current amplifier 45. The inputs 41 and 42 to the amplifier 45 receive a current signal from lines 319 and 321. Its outputs 47 and 49 are connected to respective inverters 311 and 313 that serve as buffers, having respective outputs 315 and 317. Each of the inverter circuits 311 and 313 can be made of standard, simple CMOS circuits, thus having very high input impedances. Since the loads on the amplifier output lines 47 and 49 have this very high impedance, a relatively small current input to the current amplifier 45 will drive the voltages at the output lines 47 and 49 to their maximum values. That is, when the input current exceeds a very low threshold level established by the characteristics of the amplifier circuit, the amplifier is driven into saturation. The amplifier output voltage is thus binary in form, and this binary signal is transferred by the inverters 311 and 313 to the output lines 315 and 317, respectively.

If only a single fully differential current signal is applied to the amplifier input lines 41 and 42, the circuit of FIG. 9 compares that signal with substantially zero current. The voltage outputs in lines 315 and 317 are one state when that input is of one polarity, and another state when the input is an opposite polarity. When two fully differential current signals are each connected to the amplifier input lines 41 and 42, the outputs in lines 315 and 317 switch states as the relative magnitude of one of the input signals moves from less than that of the other to a magnitude that is greater than the other.

The circuit of FIG. 9 is shown to be operating with fully differential signals but can also be used with single ended signals, where one of the two conductors carrying the signals is grounded. In that case, the signal is applied to one of the amplifier input lines 41 or 42 and a reference current is connected to the other input line.

The example of a comparator circuit shown in FIG. 9 includes a hysteresis function. Hysteresis is established by adding current to the signals applied to the amplifier inputs 41 and 42. A hysteresis circuit 330 includes current sources 331 and 333, and a switching circuit 334. It provides input bias current of one polarity when the binary signal outputs in output lines 315 and 317 are in one state, and of an opposite polarity when the outputs are in their opposite state. Positive feedback is established. The comparator threshold level is thus effectively reduced in one case and increased in the other. The amount of such reduction and increase is established by the current levels of the sources 331 and 333, which are preferably made to be the same. Hysteresis is thus symmetrically established around the desired threshold.

The constant current sources 331 and 333 provide such added current to the amplifier inputs 41 and 42 when switches 337 and 339 are closed. Current then flows to the inputs 41 and 42 through respective lines 336 and 338 in the direction of the arrows. Switches 337 and 339 are closed when the output in line 315 is at its high level and opened when this output is low. The polarity of this input bias current is reversed in the other case, namely when the output in line 317 is high. In this latter case, switches 335 and 341 are closed, and current flows in the lines 336 and 338 in a direction opposite to that of the arrows in FIG. 9. Switches 335 and 341 are closed when the output in line 317 is high and opened when low. The signals in output lines 315 and 317 are complementary, one being high while the other is low.

The amount of bias current applied to the input signal may be made to be controllable through signals in the control circuit 43. When used, a decoder 323 is connected to receive signals from the control circuit 43. Decoded signals in lines 340 and 342 control the current levels of current sources 331 and 333, respectively. If no hysteresis is desired, the user can set the outputs of these current sources to zero.

FIG. 11 shows a way of combining the amplifier, rectifier, filter, and comparators described above into a single module that allows the user to program the module to perform one or more of these functions. If this module is implemented on a single integrated circuit chip, a single such chip can then be used for any of these functions, or combinations of functions, as chosen by the user. The reference numbers used on FIG. 11 are common with those used in previous figures of the individual functional circuits, with added circuitry combining these functional circuits being referenced by unique numbers.

The module of FIG. 11 can receive two signals, selecting either one of them, or both of them together, as an input. One signal is received in lines 419 and 421, and another signal in lines 423 and 425. These signal input lines are applied to respective switching circuits 427 and 429, whose outputs are connected to lines 431 and 433. In addition to selectively allowing either one or both of the signals to be connected to the lines 431 and 433, these switching circuits allow for individually reversing the polarity of each input signal. The switching circuits 427 and 429 are controlled by signals in respective lines 435 and 437. These control signals originate In a decoder circuit 415 which is connected to the control lines 43.

This input circuit is particularly useful when the module of FIG. 11 is configured to operate as a signal comparator. Either the sum or the difference of the input signals can be chosen by the switches 427 and 429 for application to the input lines 431 and 433. The switches 427 and 429 also allow for matching the input signal polarities to that of the amplifier inputs 41 and 42.

The filter network 298 can either be connected between the input lines 431, 432 and the current amplifier inputs 41, 42, or bypassed, depending upon the state of switching circuits 447 and 449. The state of these switches is controlled by signals in lines 439 and 441, respectively, originating in the decoder 415.

The hysteresis circuit 330 can similarly be connected to the current amplifier input lines 41 and 42, or not, depending upon the state of the switches 451, as controlled by a signal in a line 443. These switches may not be necessary in all cases, since the current sources within the hysteresis circuit 330 can be set to zero when not used but it is generally desirable to disconnect the circuit from the amplifier input in any case. At the same time that the hysteresis circuit 330 is made operable, output lines 455 and 457 are connected through switches 453 to the respective outputs 315 and 317 of the inverters 311 and 313. The switches 453 are controlled by a signal in a line 445. When the module of FIG. 11 is operating as a comparator, the output switches 453 connect the output lines 455 and 457 to the buffer output lines 315 and 317, respectively.

Thus, it can be seen that the module of FIG. 11 may be programmed through the control lines 43 to operate in any of a number of capacities. By bypassing the filter network 298, turning off the hysteresis circuit 330 and connecting the output lines 455 and 457 to the current amplifier output, a current amplifier function is performed. The gain and bias level of the current amplifier 45 are set by signals in the control lines 43. If that bias current is set to zero, the module then operates as a full wave rectifier. Alternatively, when the filter network 298 is connected into the circuit, a filter function is provided. Lastly, if the filter network 298 is switched out of the circuit, the hysteresis circuit 330 connected to the current amplifier input, and the output lines 455 and 457 connected to the outputs of the inverters 311 and 313, a comparator results. The module of FIG. 11 also provides the flexibility for the user to choose two or more of these functions to operate at the same time, depending upon the application.

One advantageous class of uses of the current amplifiers, rectifier, filter, comparator and multi-function module described above is set forth in another application of Hans W. Klein, entitled "Integrated Circuit Having Programmable Analog Modules with Configurable Interconnects Between Them", filed concurrently herewith, the content of which is expressly incorporated herein by this reference.

It will be noted that the circuit descriptions given above implement the circuits with field effect transistors, which are preferably made with CMOS technology. However, it will be recognized that these circuits can alternatively be implemented with bipolar, BICMOS or other appropriate devices and processes.

Although the various aspects of the present invention have been illustrated and described in a form of their preferred embodiments, it is to be understood that the invention is to be protected within the full scope of the appended claims.

It is claimed:

1. A current signal comparator, comprising:

first and second mirroring transistors being supplied a substantially constant current from respective first and second current sources, a current input connected to add to the current supplied to at least one of the mirroring transistors, said first mirroring transistor being connected to mirror its current to first and second output transistors, said second mirroring transistor being connected to mirror its current to third and fourth output transistors, said first and third output transistors being connected in series across a voltage source with a first output node therebetween, said second and fourth output transistors being connected in series across the voltage source with a second output node therebetween, means connected to the first output node for providing a first output signal having a first voltage level when the amplifier input is above a first given current threshold and a second voltage level when the amplifier input is below said first given current threshold, and means connected to the second output node for providing a second output signal having the first voltage level when the amplifier input is below said second given current threshold and the second voltage level when the amplifier input is above said second given current threshold.

2. The comparator according to claim 1, which additionally comprises means responsive to at least one of said first and second output signals for adding a preset level of current to said current signal input when said at least one of said first and second output signals is at one of said first and second voltage levels and for subtracting said preset level of current from said current signal input when said at least one of said first and second output signals is at the other of said first and second voltage levels, whereby hysteresis is provided.

3. The comparator according to claim 2 wherein said means for adding to and subtracting from said current signal input includes at least one current source and a switching network connecting said at least one current source to said current signal input with a current direction that is responsive to the voltage level of said at least one of said first and second output signals.

* * * * *